United States Patent [19]

Akazawa et al.

[11] Patent Number: 4,924,188

[45] Date of Patent: May 8, 1990

[54] SPREAD SPECTRUM RECEIVER HAVING PHASE SHIFTER FOR EFFECTING PHASE SYNCHRONIZATION OF TWO CONVOLVERS

[75] Inventors: Shigeo Akazawa; Masaharu Mori; Masahiro Hamatsu, all of Tokyo, Japan

[73] Assignee: Clarion Co., Ltd., Tokyo, Japan

[21] Appl. No.: 250,236

[22] Filed: Sep. 27, 1988

[30] Foreign Application Priority Data

Oct. 6, 1987 [JP] Japan .................. 62-251910

[51] Int. Cl.$^5$ .................. H03K 5/13; H04B 15/00
[52] U.S. Cl. .................. 328/155; 328/109; 375/1; 307/262; 307/511
[58] Field of Search .................. 328/155, 55, 109, 133, 328/24; 307/262, 511, 479; 375/1

[56] References Cited

U.S. PATENT DOCUMENTS

| | | | |
|---|---|---|---|
| 3,475,626 | 10/1969 | Holzman et al. | 328/55 |
| 4,335,442 | 6/1982 | Backe | 328/14 |
| 4,379,264 | 4/1983 | Lenhardt | 328/24 |
| 4,484,296 | 11/1984 | Treise et al. | 328/14 |
| 4,625,177 | 11/1986 | Conway et al. | 328/14 |
| 4,866,734 | 9/1989 | Akazawa et al. | 375/1 |

*Primary Examiner*—Stanley D. Miller
*Assistant Examiner*—Richard Roseen
*Attorney, Agent, or Firm*—Flynn, Thiel, Boutell & Tanis

[57] ABSTRACT

A phase shifter is disclosed which performs a desired phase shift by distributing an input signal to two signals whose phases are different by 90° from each other which signals are added to each other after having been weighted with a sine and a cosine function signal, the sine and the cosine function signal being able to be set in a digital manner.

4 Claims, 4 Drawing Sheets

SPREAD SPECTRUM RECEIVER HAVING PHASE SHIFTER FOR EFFECTING PHASE SYNCHRONIZATION OF TWO CONVOLVERS

FIELD OF THE INVENTION

This invention relates to a phase shifter and in particular to an improvement in the phase shifter which can be used in practice in a high frequency circuit such as a receiver for spread spectrum communication.

BACKGROUND OF THE INVENTION

FIGS. 4a and 4b illustrate prior art phase shifters. FIG. 4a indicates a passive type phase shifter consisting of resistances R and R/2, a capacitance C and an inductance L while FIG. 4b indicates an active type phase shifter consisting of an operational amplifier AMP, resistances R and R' and a capacitance C.

In the phase shifter indicated in FIG. 4a, if the inductance L and the capacitance C are selected so as to satisfy:

$$L = \frac{2R}{\alpha_0} \quad (1)$$

$$C = \frac{2}{\alpha_0 R} \quad (2)$$

the frequency characteristics thereof are represented by curves as indicated in FIG. 5. As it can be clearly seen from the figure, the amplitude is constant and the phase is given by:

$$\theta(\omega) = -2\tan^{-1}\frac{\omega}{\alpha_0} \quad (3)$$

Also in the phase shifter indicated in FIG. 4b, in the same way, the frequency characteristics that the amplitude is constant and the phase is given by Equation 3 are obtained by selecting the resistance R and the capacitance C so as to satisfy:

$$\alpha_0 = \frac{1}{RC} \quad (4)$$

However, in the case when the phase is controlled in a wide range (at least from 0° to 360°), the phase shifters indicated in FIGS. 4a and 4b are not suitable because it is necessary to connect at least 2 of the circuits indicated in FIGS. 4a and 4b in cascade as it is clearly seen from FIG. 5 and both the values L and C should be variable for the circuit indicated in FIG. 4a as it can be understood from Equations (1) and (2). Further, in order to keep the amplitude constant, the relation between L and C should be kept constant and it is difficult to control the phase from the exterior. Next, it makes the phase shifter indicated in FIG. 4b unsuitable for use in a high frequency circuit that an operational amplifier AMP is required therefor. That is, it is not easy to realize a high input impedance, a low output impedance, a high gain, etc. which are necessary conditions for the operational amplifier in a high frequency. In prior art, phase shifters other than those indicated in FIGS. 4a and 4b in order to keep the amplitude constant both the inductance and the capacitance should varied and sometimes the amplitude can not be kept constant. Thus it is unsuitable for the phase control from the exterior and in particular for automatic control.

OBJECT OF THE INVENTION

Consequently the object of this invention is to provide a phase shifter which can vary the phase basically in the infinite region; has frequency characteristics that the amplitude is constant and only the phase varies; can vary easily the phase; and is suitable for the phase control from the exterior.

SUMMARY OF THE INVENTION

In order to meet the foregoing object, a spread-spectrum receiver according to the invention includes: a correlator which includes first and second convolvers each having first and second inputs, the first inputs each being supplied with a common spread-spectrum received signal; a first multiplier for applying a first reference signal produced by multiplication of a first CW signal and a first PN code to the second input of the first convolver; a signal distributor supplied with the first CW signal for distributing the first CW signal into first and second signals which are different in phase by 90 degrees; a function signal generator responsive to a predetermined digital signal for generating a sine function signal and a cosine function signal; a weighting arrangement for weighting the first and second signals by the sine function signal and the cosine function signal, respectively; a phase shifter which includes an adder for adding the weighted first and second signals from the weighting arrangement to generate a second CW signal which has the same frequency as and a predetermined phase difference from the first CW signal; a second multiplier for applying a second reference signal produced by multiplication of the second CW signal and a second PN code to the second input of the second convolver; and a demodulator for demodulating data by multiplying outputs of both of the convolvers.

In the phase shifter according to this invention, the function signal generating means described above consists of memories and D/A converters and sends the digital signal outputted by the memories by giving the memory address data corresponding to the desired phase angle to be shifted after having been D/A-converted in order to phase-shift the input signal by a desired phase angle.

DETAILED DESCRIPTION

Figure 1:
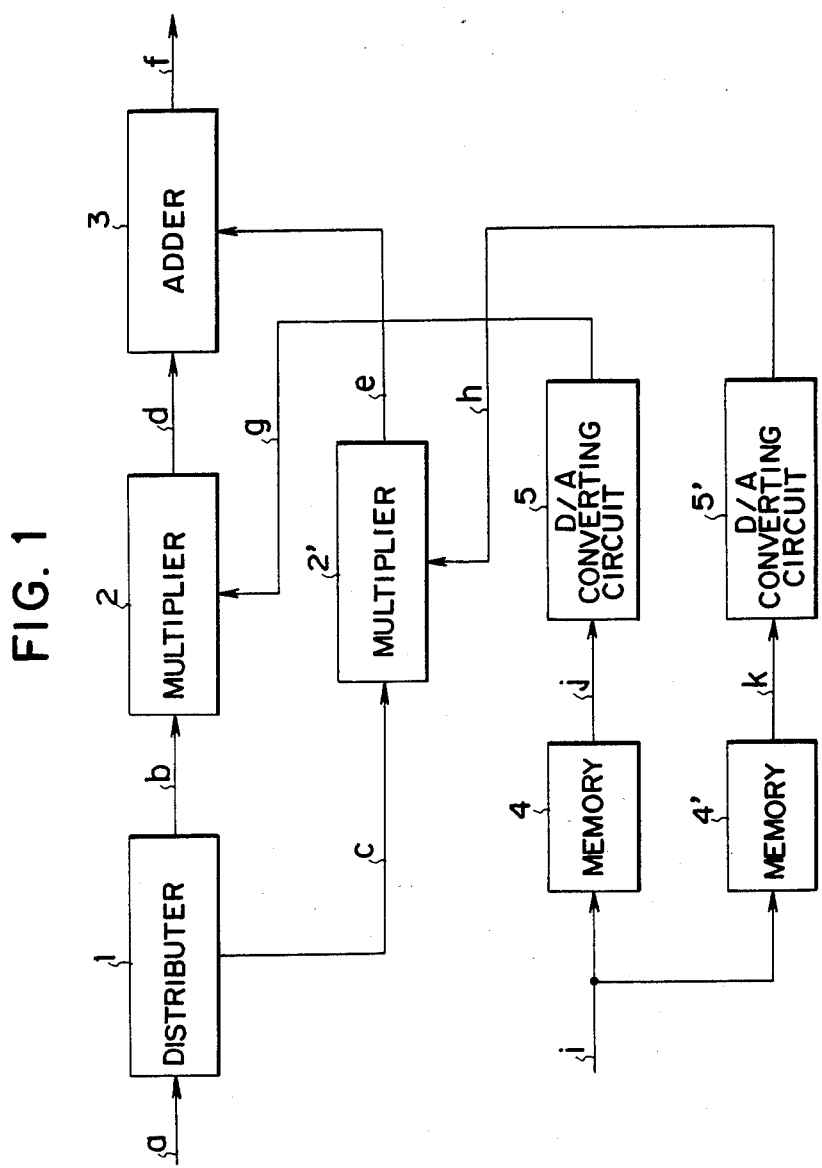
FIG. 1 is a block diagram of a phase shifter circuit.

Hereinbelow this invention will be explained by referring to an embodiment indicated in the drawings in which FIG. 1 illustrate an embodiment of the phase shifter according to this invention.

In the figure, reference numeral 1 is a distributer; 2 and 2' are weighting means, e.g. multipliers; 3 is an adder; 4 and 4' are memories; and 5 and 5' are D/A converting circuits.

An input signal a to be phase-shifted is given to the distributer 1 and distributed to a first and a second signal b and c respectively whose phases are different by 90° from each other which are sent to the multipliers 2 and 2'.

On the other hand, sine and cosine function data SIN$\phi$ and COS$\phi$ are stored in the memories 4 and 4' respectively and digital signals j and k representing desired sine and cosine functions are read-out by address data i.

These digital signals are D/A-converted by the D/A converting circuits 5 and 5'. The sine and the cosine function signal h and g obtained as the result are given to one input of the multipliers 2 and 2' and multiplied by the first and the second signal given to the other input thereof. The outputs of the multipliers are added to each other by the adder 3 and an output signal f which is identical to the input signal a whose phase is shifted by $\phi$ is obtained.

The operation of the phase shifter described above will be explained more concretely. The input signal a which is represented e.g. by COS$\omega_0 t$ is inputted in the distributer 1 and distributed to the signals b and c whose phases are different by 90° from each other. That is, the phase of the signal c is represented by COS$\omega_0 t$ and that of the signal b by SIN$\omega_0 t$. The signal b is multiplied by a DC current g corresponding to SIN$\phi$ in the multiplier 2 which outputs a signal d represented by SIN$\omega_0 t \cdot$SIN$\phi$. On the other hand, the signal c is multiplied by another DC current h corresponding to COS$\phi$ in the multiplier 2' which outputs a signal e represented by COS$\omega_0 t \cdot$COS$\phi$. These signals d and e are added by the adder 3 to each other and the output signal f whose phase is shifted by $\phi$ with respect to the input signal a can be obtained.

This operation can be represented by equations as follows:

| input signal a | COS$\omega_0 t$ |
|---|---|
| signal b | SIN$\omega_0 t$ |
| signal c | COS$\omega_0 t$ |
| signal d | SIN$\omega_0 t \cdot$ SIN$\phi$ |
| signal e | COS$\omega_0 t \cdot$ COS $\phi$ |
| output signal f | COS($\omega_0 t - \phi$) |
| signal g | SIN$\phi$ |
| signal h | COS$\phi$ |

When the signals d and e are added by the adder 3 to each other, this operation can be given by:

$$SIN\omega_o t \cdot SIN\phi + COS\omega_O t \cdot COS\phi =$$

$$\tfrac{1}{2}\{COS(\omega_o t - \phi) - COS(\omega_o t + \phi)\} +$$

$$\tfrac{1}{2}\{COS(\omega_o t - \phi) + COS(\omega_o t + \phi)\} =$$

$$COS(\omega_o t - \phi)$$

The output signal f whose phase is delayed by $\phi$ with respect to the input signal a is thus obtained.

In order to obtain the signals g and h, address data i corresponding to the phase $\phi$ are given to the memories 4 and 4' respectively. Data of SIN$\phi$ are stored at the address corresponding to the phase $\phi$ in the memory 4 and data of COS$\phi$ are stored at the address corresponding to the phase $\phi$ in the memory 4' which output the data i of SIN$\phi$ and the data k of COS$\phi$ respectively. These digital data of SIN$\phi$ are converted into the DC current g corresponding to SIN$\phi$ by the D/A converting circuit 5 and the digital data of COS$\phi$ are converted into the DC current h corresponding to COS$\phi$ by the D/A converting circuit 5'.

Further, it is sufficient for the DC currents g and h to satisfy relatively the relation between SIN$\phi$ and COS$\phi$ and it is unnecessary to adjust the absolute values thereof. It is thus possible for the phase shifter according to this invention to make adjustment unnecessary.

Furthermore, even if there are disposed no memories separately, the phase shifter is so constructed that SIN$\phi$ and COS$\phi$ are calculated by a CPU starting from $\phi$, and they are given directly to the D/A converting circuits.

Figure 2:
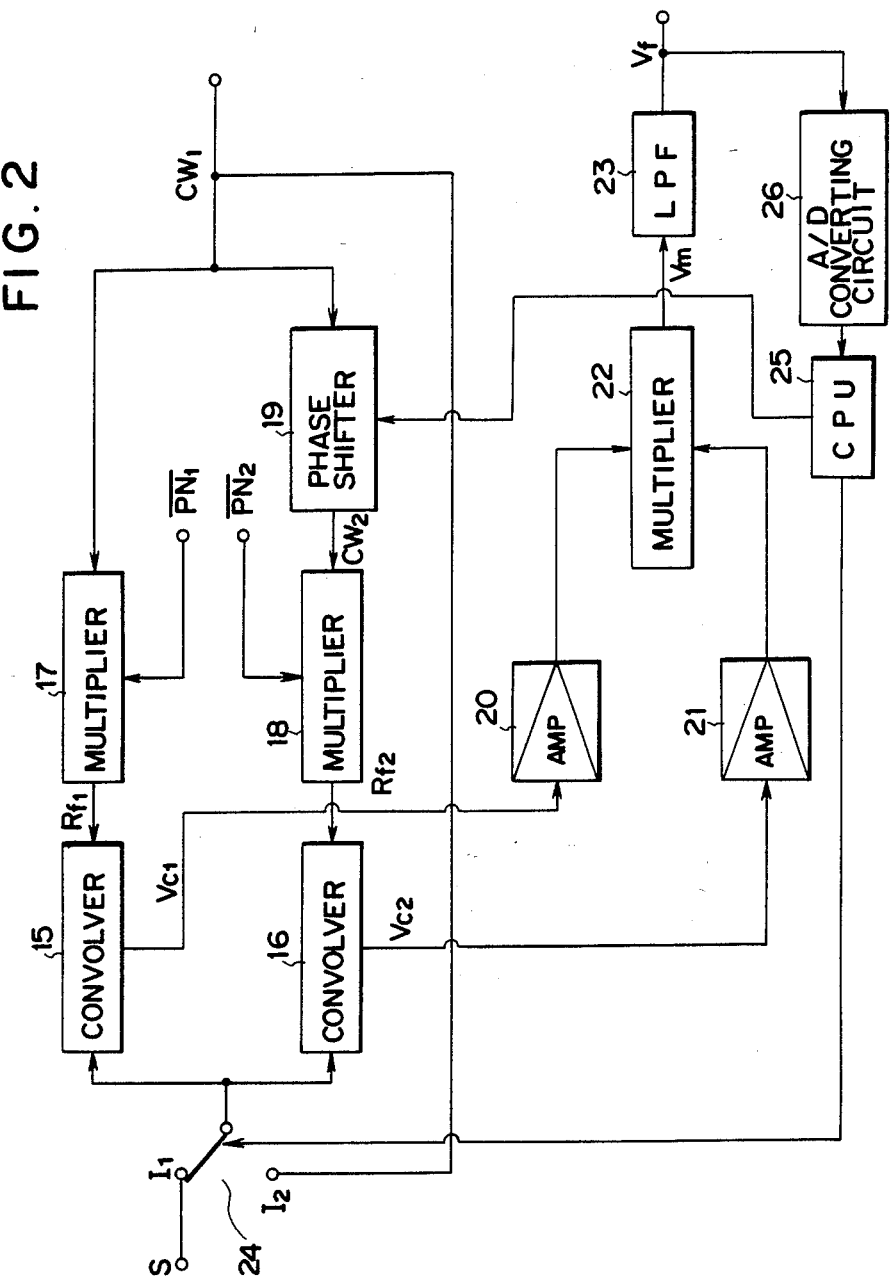
FIG. 2 is a block diagram of a spread-spectrum receiver embodying the present invention, one component of which is the phase shifter circuit of FIG. 1.

FIG. 2 shows a constructional example of a receiver for spread spectrum communication using the phase shifter indicated in FIG. 1 in which reference numerals 15 and 16 are convolvers; 17 and 18 are multipliers; 19 is a phase shifter having the construction identical to that indicated in FIG. 1; 20 and 21 are amplifiers; 22 is a multiplier; 23 is a low pass filter; 24 is a switch; 25 is a CPU for the phase control; and 26 is an A/D converting circuit.

When the switch 24 is turned over on the contact $I_1$ side by the CPU 25, a received spread spectrum communication signal S is applied to one input of each of the convolvers 15 and 16 and a first and a second reference signal $R_{f1}$ and $R_{f2}$ are applied to the other inputs thereof.

A CW signal $CW_1$ having the same frequency as the RF carrier signal in the spread spectrum communication signal S is given to one input of each of the phase shifter 19 and the multiplier 17. The phase shifter 19 shifts the phase of the CW signal $CW_1$ by 90° and supplies it to one input of the multiplier 18. PN codes $\overline{PN_1}$ and $\overline{PN_2}$ necessary for demodulation are given to the other inputs of the multipliers 17 and 18 respectively and the outputs of the multipliers 17 and 18 are the first and the second reference signal $R_{f1}$ and $R_{f2}$ respectively.

The convolvers 15 and 16 correlate the spread spectrum communication signal S with the first and the second reference signal $R_{f1}$ and $R_{f2}$ respectively. The correlation outputs $V_{c1}$ and $V_{c2}$ are applied to the multiplier 22 through the amplifiers 20 and 21 respectively and the output of the multiplier is given to the low pass filter 23 so as to obtain the data demodulation signal $V_f$.

It is explained how the data demodulation signal $V_f$ can be obtained starting from the spread spectrum communication signal S received by the construction of the embodiment described above.

The received spread spectrum communication signal S can be represented by:

$$S = Vd(t) = P_1(t)SIN(\omega_0 t) + A \cdot P_2(t)COS(\omega_0 t) \qquad (1)$$

where $P_1(t)$ and $P_2(t)$ are the first and the second PN code respectively which are used at the modulation on the transmitter side; A represents data which are 1 and $-1$; and the signal S is equally given to the two convolvers.

The first and the second reference signal $R_{f1}$ and $R_{f2}$ inputted in the two convolvers can be represented by:

$$R_{f1} = V_{r1}(t) = \overline{P_1(t)}COS(\omega_0 t) \qquad (2)$$

$$R_{f2} = V_{r2}(t) = \overline{P_2(t)}COS(\omega_0 t + \theta) \qquad (3)$$

where $\theta$ indicates the phase shifted by the phase shifter; $P_1(t)$ and $P_2(t)$ are the PN codes $\overline{PN_1}$ and $\overline{PN_2}$ used at the demodulation on the receiver side which are mirror images (time inverted signal) of $P_1(t)$ and $P_2(t)$ used on the transmitter side.

The outputs $V_{c1}$ and $V_{c2}$ of the two convolvers are given by:

$$V_{c1}(t) = \text{CONV}\{Vd(t), V_{r1}(t)\} \quad (4)$$

$$V_{c2}(t) = \text{CONV}\{Vd(t), V_{r2}(t)\} \quad (5)$$

where $\text{CONV}\{V_1(t), V_2(t)\}$ represents the convolution of the two inputs $V_1(t)$ and $V_2(t)$. Supposing that $$V_1(t) = \cos(\omega_0 t) \quad (6)$$

$$V_2(t) = \cos(\omega_0 t + \theta) \quad (7)$$

the output of the convolver $\text{CONV}\{V_1(t), V_2(t)\}$ is given by:

$$\text{CONV}\{V_1(t), V_2(t)\} = \eta \cdot \cos(2\omega_0 t + \theta + \phi) \quad (8)$$

where $\eta$ is the convolver efficiency and $\phi$ is the additional phase which is proper to the convolver. In this way, it can be understood that variations in phase $\theta$ of the one input appear at the output as they are.

Since the correlations between $P_1(t)$ and $\overline{P_2(t)}$ and between $P_2(t)$ and $\overline{P_1(t)}$ are small, the following approximation $$V_{c1}(t) \approx \text{CONV}\{P_1(t)\sin(\omega_0 t), \overline{P_1(t)}\cos(\omega_0 t)\} \quad (9)$$

$$V_{c2}(t) \approx \text{CONV}\{A \cdot P_2(t)\cos(\omega_0 t), \overline{P_2(t)}\cos(\omega_0 t + \theta)\} \quad (10)$$

do not give rise to great errors. Equations (9) and (10) are further solved as follows:

$$V_{c1}(t) = \eta_1 \cdot R_1(t)\sin(2\omega_0 t + \phi_1) \quad (11)$$

$$V_{c2}(t) = \eta_2 \cdot A \cdot R_2(t)\cos(2\omega_0 t + \theta + \phi_2) \quad (12)$$

where $R_1(t)$ and $R_2(t)$ are convolutions between $P_1(t)$ and $\overline{P_1(t)}$ and between $P_2(t)$ and $\overline{P_2(t)}$; and $\phi_1$ and $\phi_2$ are additional phases which are proper to the two convolvers respectively.

The output $V_m(t)$ after the multiplication of $V_{c1}(t)$ and $V_{c2}(t)$ is given by:

$$\begin{aligned} Vm(t) &= V_{C1}(t) \cdot V_{C2}(t) \\ &= \eta_1 \cdot \eta_2 \cdot A \cdot R_1(t) \cdot R_2(t) \cdot \cos(2\omega_0 t + \phi_1) \cdot \\ &\quad \cos(2\omega_0 t + \theta + \phi_2) \end{aligned} \quad (13)$$

In Equation (13) supposing that $$\theta + \phi_2 = \phi_1 - \pi/2 \quad (14)$$

the following equation is obtained:

$$\begin{aligned} Vm(t) &= \eta_1 \cdot \eta_2 \cdot A \cdot R_1(t) \cdot R_2(t) \cdot \sin(2\omega_0 t + \phi_1) \cdot \\ &\quad \cos(2\omega_0 t + \phi_1 - \pi/2) \\ &= \eta_1 \cdot \eta_2 \cdot A \cdot R_1(t) \cdot R_2(t) \cdot \sin^2(2\omega_0 t + \phi_1) \end{aligned} \quad (15)$$

Further, the demodulation signal $V_f(t)$ obtained by making $V_m(t)$ pass through a low pass filter is given by:

$$V_f(t) = \eta_1 \cdot \eta_2 \cdot A \cdot R_1(t) \cdot R_2(t) \quad (17)$$

Figure 3A:
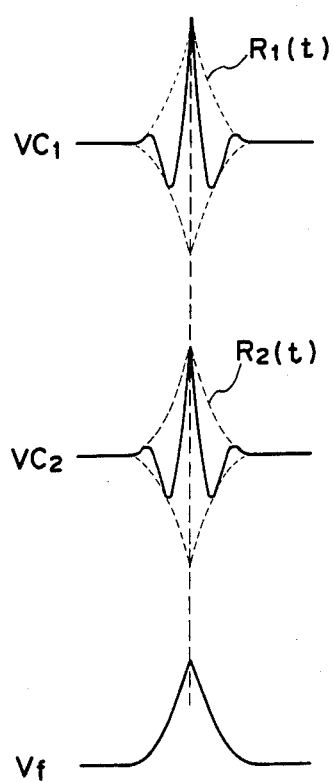
FIGS. 3A and 3B show waveforms for certain signals in the receiver of FIG. 2.
Figure 3B:
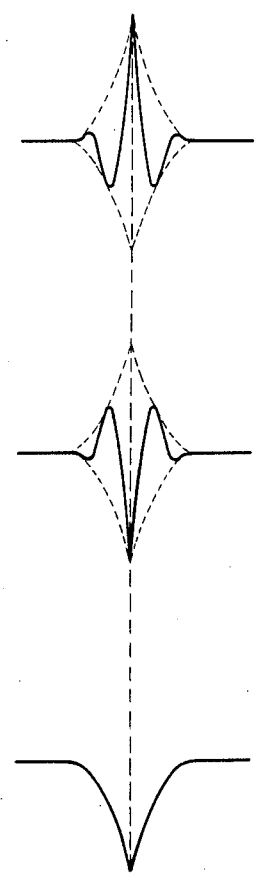
Figure 4A:
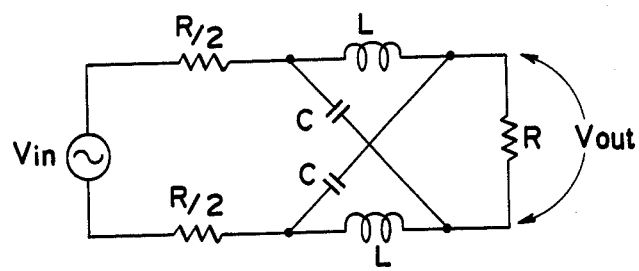
FIGS. 4A and 4B are schematic diagrams of conventional phase shifter circuits.
Figure 4B:
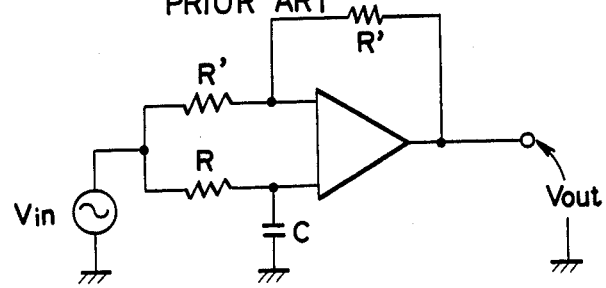
Figure 5:
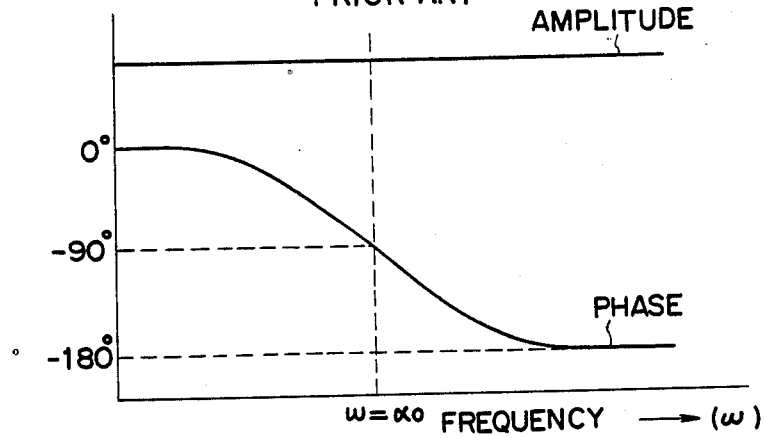
FIG. 5 is a graph showing a characteristic of the phase shifter of FIG. 4A.

FIG. 3 shows an example of $V_{c1}(t)$, $V_{c2}(t)$ and $V_f(t)$ in the case where $\phi_1 = \phi_2$ and from the figure and Equation (17), it can be seen that the data demodulation is possible.

However, in Equation (14), if $\theta + \phi_2 = \phi_1$, $V_f(t) = 0$ is valid which means that the demodulation is not possible. As stated previously, $\phi_1$ and $\phi_2$ are not always identical due to slight differences in electric characteristics, temperature characteristics and the length of wiring of the two convolvers.

Consequently, in this case, it can be seen that starting from Equation (14), the predetermined phase shift $\theta$ of the phase shifter may be given by:

$$\theta = \phi_1 - \pi/2 - \phi_2 \quad (16)$$

Therefore, in order to correct the phase shift in such a case in FIG. 2, the switch 24 is turned over to the contact $I_2$ side by the CPU 25 so that the CW signal $CW_1$ is given to one of the input of the convolvers 15 and 16 and further the first and the second PN code are switched over to DC bias voltages.

The input signal being represented by $V_d(t)$, since $$Vd(t) = \cos(\omega_0 t) \quad (18)$$

is valid and further the first and the second PN code are switched over to the DC bias voltages, the following relation is satisfied:

$$\overline{P_1(t)} = \overline{P_2(t)} = 1 \quad (19)$$

Consequently, the convolution outputs $V'_{c1}(t)$ and $V'_{c2}(t)$ are given by:

$$V'_{c1}(t) = \eta_1 \cdot \cos(2\omega_0 t + \phi_1) \quad (20)$$

$$V'_{c2}(t) = \eta_2 \cdot \cos(2\omega_0 t + \phi_2) \quad (21)$$

Then the output $V'_m(t)$ after the multiplication of $V'_{c1}(t)$ and $V'_{c2}(t)$ is represented by:

$$V'm(t) = \eta_1 \cdot \eta_2 \cdot \cos(2\omega_0 t + \phi_1) \cdot \cos(2\omega_0 t + \phi_2) \quad (22)$$

Here, if $$\theta + \phi_2 = \phi_1 - \pi/2 \quad (23)$$

Equation (22) can be transformed into:

$$V'm(t) = \eta_1 \cdot \eta_2 \cdot \cos(2\omega_0 t + \phi_1) \cdot \sin(2\omega_0 t + \phi_1) \quad (24)$$

and thus the output $V'_f(t)$ of the low pass filter is given by:

$$V'_f(t) \propto \eta_1 \cdot \eta_2 \cdot \cos(\phi_1 - \theta - \phi_2) \quad (25)$$

The output $V'_f(t)$ stated above is transformed into a digital signal by the A/D converting circuit 26 which signal is inputted in the CPU 25. The CPU 25 outputs the address data corresponding to the phase $\theta$ which is in the state represented by Equation (16), to the phase shifter 19 responding to the digital signal and performs the phase control.

In this case, it is undetermined what values $\phi_1$ and $\phi_2$ have and it happened that a prior art phase shifter could not cover the variable region of this phase shift angle. On the contrary, the phase shifter having the construction according to this invention can shift the phase continuously. In addition, since the variable region of the phase shift is not restricted, the phase shifter is suitable for a receiver for spread spectrum communication, etc.

As it is clearly seen from the explanation described above according to this invention, excellent effects stated below can be obtained;

(i) it is possible to vary easily the phase merely by varying address data given to the memories;

(ii) it is possible to set arbitrarily the amount of variation in the phase by varying the resolution of the data of SIN$\phi$ and COS$\phi$ stored in the memories;

(iii) it is possible to vary the phase continuously by storing only data in a region $0° < \phi < 360°$ for the data of SIN$\phi$ and COS$\phi$ stored in the memory;

(iv) it is possible to realize a phase shifter which keeps the amplitude constant and makes only phase vary in a wide frequency region and in particular even in a high frequency region;

(v) owing to (i) and (iii) automatic control can be performed easily by means of a microcomputer, etc.;

(vi) owing to (i) to (iii) it is possible to obtain a phase shifter for which adjustment is unnecessary; and (vii) it is possible to realize a phase shifter which is suitable particularily for a high frequency circuit such as a receiver for spread spectrum communication for which prior art phase shifters can not work efficiently.

What is claimed is:

1. A spread-spectrum receiver, comprising:

a correlator which includes first and second convolvers each having first and second inputs, said first inputs each being supplied with a common spread-spectrum received signal;

first multiplier means for applying a first reference signal produced by multiplication of a first CW signal and a first PN code to said second input of said first convolver;

signal distributing means supplied with said first CW signal for distributing said first CW signal into first and second signals which are different in phase by 90 degrees;

function signal generating means responsive to a predetermined digital signal for generating a sine function signal and a cosine function signal;

weighting means for weighting said first and second signals by said sine function signal and said cosine function signal, respectively;

adder means for adding said weighted first and second signals from said weighting means to generate a second CW signal which has the same frequency as and a predetermined phase difference from said first CW signal;

second multiplier means for applying a second reference signal produced by multiplication of said second CW signal and a second PN code to said second input of said second convolver; and demodulating means for demodulating data by multiplying outputs of both of said convolvers.

2. A spread spectrum receiver according to claim 1, wherein said function signal generating means includes two memories respectively storing sine function data and cosine function data, and two digital to analog converters which each convert a digital output signal from a respective one of said memories into a respective analog signal, said analog signals being said sine function signal and said cosine function signal.

3. A spread spectrum receiver according to claim 2, wherein said weighting means includes two further multipliers which each have a first input to which is applied a respective one of said sine and cosine function signals from said digital to analog converters and which each have a second input to which is applied a respective one of said first and second signals.

4. A spread spectrum receiver according to claim 1, including switch means for selectively supplying one of said spread-spectrum received signal and said first CW signal to said first inputs of said first and second convolvers; and digital circuit means for causing said switch means to supply said first CW signal to said convolvers and for simultaneously calculating said predetermined digital signal for said function signal generating means in response to an output signal from said demodulating means.

* * * * *